US012080687B2

(12) United States Patent
Cha

(10) Patent No.: US 12,080,687 B2
(45) Date of Patent: Sep. 3, 2024

(54) UNIT PIXEL HAVING LIGHT EMITTING DEVICE, METHOD OF FABRICATING THE SAME, AND DISPLAYING APPARATUS HAVING THE SAME

(71) Applicant: SEOUL VIOSYS CO., LTD., Gyeonggi-do (KR)

(72) Inventor: Namgoo Cha, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 310 days.

(21) Appl. No.: 17/495,460

(22) Filed: Oct. 6, 2021

(65) Prior Publication Data

US 2022/0123184 A1    Apr. 21, 2022

Related U.S. Application Data

(60) Provisional application No. 63/092,791, filed on Oct. 16, 2020.

(51) Int. Cl.
*H01L 25/075* (2006.01)
*H01L 33/10* (2010.01)
*H01L 33/58* (2010.01)
*H01L 33/60* (2010.01)
*H01L 33/62* (2010.01)

(52) U.S. Cl.
CPC .......... *H01L 25/0753* (2013.01); *H01L 33/10* (2013.01); *H01L 33/58* (2013.01); *H01L 33/60* (2013.01); *H01L 33/62* (2013.01); *H01L 2933/0058* (2013.01)

(58) Field of Classification Search
None
See application file for complete search history.

(56) References Cited

U.S. PATENT DOCUMENTS

| 6,818,539 | B1* | 11/2004 | Kanda | H01L 24/03 |
| | | | | 257/E23.021 |
| 2016/0293811 | A1* | 10/2016 | Hussell | H01L 27/156 |
| 2018/0090539 | A1* | 3/2018 | Son | H01L 33/405 |
| 2018/0151780 | A1 | 5/2018 | Jang et al. | |
| 2020/0381474 | A1* | 12/2020 | Choi | H01L 33/44 |
| 2021/0399041 | A1* | 12/2021 | Park | H01L 33/62 |
| 2022/0115563 | A1* | 4/2022 | He | H01L 33/0095 |

FOREIGN PATENT DOCUMENTS

| JP | 2004153277 A | 5/2004 |
| KR | 1020180059406 A | 6/2018 |
| KR | 1020190026617 A | 3/2019 |
| KR | 1020190053500 A | 5/2019 |

OTHER PUBLICATIONS

International Search Report (English Translation), issued in corresponding International Application No. PCT/KR2021/014234, mailed Jan. 25, 2022, 3 pages.

* cited by examiner

*Primary Examiner* — Feifei Yeung Lopez
(74) *Attorney, Agent, or Firm* — LaBatt, LLC

(57) ABSTRACT

A unit pixel is provided. The unit pixel includes a transparent substrate, a first light blocking layer disposed on the transparent substrate and having windows that transmit light, an adhesive layer covering the first light blocking layer, a plurality of light emitting devices disposed on the adhesive layer to be arranged on the windows, and a second light blocking layer covering side surfaces of the light emitting devices.

20 Claims, 11 Drawing Sheets

US 12,080,687 B2

UNIT PIXEL HAVING LIGHT EMITTING DEVICE, METHOD OF FABRICATING THE SAME, AND DISPLAYING APPARATUS HAVING THE SAME

CROSS-REFERENCE OF RELATED APPLICATIONS AND PRIORITY

The Present Application is a Non-provisional Application which claims priority to and benefit of U.S. Provisional Application No. 63/092,791 filed Oct. 16, 2020, the disclosure of which are incorporated by reference in its entirety as if fully set forth herein.

TECHNICAL FIELD

Exemplary embodiments relate to a unit pixel having a light emitting device, a method of fabricating the same, and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response, than conventional light sources, and thus, the light emitting diodes have been replacing the conventional light sources.

The conventional light emitting diodes have been generally used as backlight light sources in displaying apparatuses. However, displaying apparatuses that directly realize images using the light emitting diodes have been recently developed. Such displays are also referred to as micro LED displays.

In general, a displaying apparatus displays various colors through mixture of blue, green, and red light. In order to realize various images, the displaying apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub pixel, and, accordingly, a large number of micro LEDs need to be arranged on a single substrate. However, the micro LED is extremely small, for example, 200 µm or less, further 100 µm or less.

Meanwhile, light interference between adjacent sub-pixels makes it difficult to achieve high color reproducibility and high contrast.

SUMMARY

Exemplary embodiments provide a unit pixel suitable for being mounted on a circuit board and a displaying apparatus having the same.

Exemplary embodiments provide a unit pixel capable of preventing light interference to achieve high color reproducibility, and a displaying apparatus having the same.

An exemplary embodiment provides a unit pixel, the unit pixel including a transparent substrate, a first light blocking layer disposed on the transparent substrate and having windows that transmit light, an adhesive layer covering the first light blocking layer, a plurality of light emitting devices disposed on the adhesive layer to be arranged on the windows, and a second light blocking layer covering side surfaces of the light emitting devices.

An exemplary embodiment provides a method of fabricating a unit pixel, the method including preparing a transparent substrate, forming a first light blocking layer having a plurality of windows on the transparent substrate, forming an adhesive layer covering the first light blocking layer, mounting light emitting devices on the adhesive layer to correspond to the windows, and forming a second light blocking layer covering side surfaces of the light emitting devices.

An exemplary embodiment provides a displaying apparatus including a circuit board and unit pixels mounted on the circuit board. Each of the unit pixels includes a transparent substrate, a first light blocking layer disposed on the transparent substrate and having windows that transmit light, an adhesive layer covering the first light blocking layer, a plurality of light emitting devices disposed on the adhesive layer to be arranged on the windows, and a second light blocking layer covering side surfaces of the light emitting devices.

DESCRIPTION OF DRAWINGS

FIG. 7A illustrates forming a concave-convex pattern on an upper surface of a transparent substrate;

FIG. 7B illustrates forming a first light blocking layer on the transparent substrate;

FIG. 7C illustrates forming an adhesive layer on the first light blocking layer;

FIG. 7D illustrates forming a second light blocking layer;

FIG. 7E illustrates forming a step adjustment layer; and

FIG. 7F illustrates forming first, second, third and fourth connection layers on the step adjustment layer.

DETAILED DESCRIPTION OF THE ILLUSTRATED EMBODIMENTS

Figure 1:
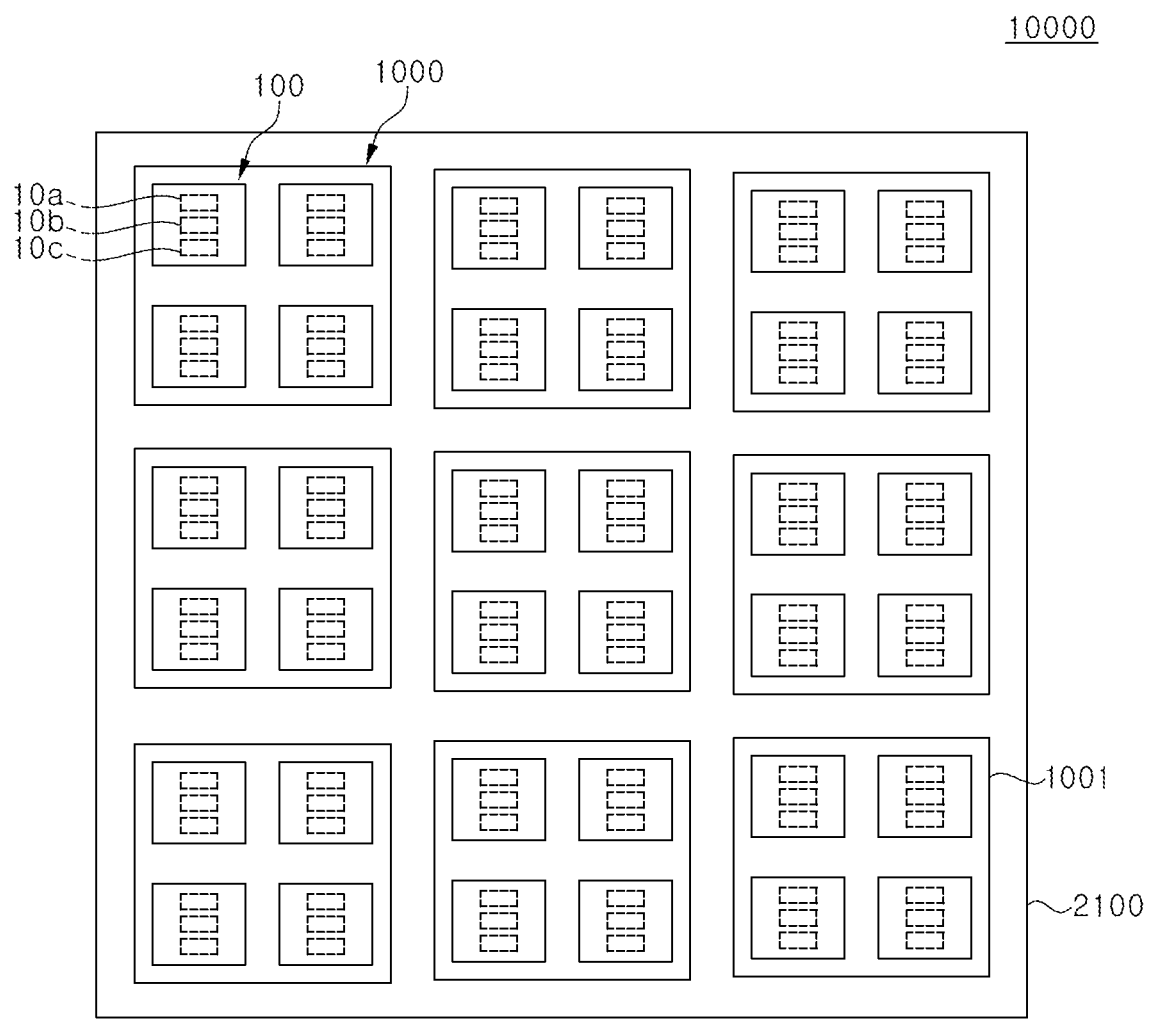
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A unit pixel according to an exemplary embodiment includes: a transparent substrate; a first light blocking layer disposed on the transparent substrate and having windows that transmit light; an adhesive layer covering the first light blocking layer; a plurality of light emitting devices disposed on the adhesive layer to be arranged on the windows; and a second light blocking layer covering side surfaces of the light emitting devices.

The second light blocking layer may cover the side surfaces of the light emitting devices to prevent light interference between the light emitting devices.

Each of the first light blocking layer and the second light blocking layer may include a light absorbing material.

Each of widths of the light emitting devices may have a size smaller than a width of a corresponding window, and the second light blocking layer may cover gaps formed between the light emitting devices and the first light blocking layer around the corresponding windows.

As such, it is possible to prevent light from leaking through the gaps, and thus, color reproducibility may be increased, and light contrast may be improved. In addition, it is possible to prevent metal layers such as a connection layer from being observed through the gaps.

In an exemplary embodiment, the second light blocking layer may be divided into one another and cover corresponding light emitting devices.

In another exemplary embodiment, the second light blocking layer may continuously cover the light emitting devices.

The second light blocking layer may cover the adhesive layer around the light emitting devices.

The unit pixel may further include a step adjustment layer covering the second light blocking layer, and the second light blocking layer and the step adjustment layer may have openings exposing the light emitting devices.

In an exemplary embodiment, the step adjustment layer may be formed of a light-transmitting material. For example, the step adjustment layer may be formed of polyimide.

In an exemplary embodiment, the step adjustment layer may contact the adhesive layer around the second light blocking layer.

In another exemplary embodiment, the step adjustment layer may be spaced apart from the adhesive layer by the second light blocking layer.

The unit pixel may further include connection layers electrically connected to the light emitting devices through the openings of the second light blocking layer and the step adjustment layer; and an insulation material layer covering the connection layers, in which the insulation material layer may have openings exposing the connection layers.

The step adjustment layer and the insulation material layer may have side surfaces inclined to have an inclination angle less than 90 degrees with respect to an upper surface of the adhesive layer.

In another variant, each width of the light emitting devices has a size smaller than a width of a corresponding window, and the second light blocking layer covers gaps between each width of the light emitting devices and the width of the corresponding window.

In another variant, the second light blocking layer is divided into one another at multiple locations and covers corresponding light emitting devices at the multiple locations.

In another variant, the second light blocking layer continuously covers the light emitting devices. The second light blocking layer covers the adhesive layer around the light emitting devices. The step adjustment layer contacts the adhesive layer around the second light blocking layer.

A method of fabricating a unit pixel according to an exemplary embodiment includes preparing a transparent substrate, forming a first light blocking layer having a plurality of windows on the transparent substrate, forming an adhesive layer covering the first light blocking layer, mounting light emitting devices on the adhesive layer to correspond to the windows, and forming a second light blocking layer covering side surfaces of the light emitting devices.

The first and second light blocking layers may include a light absorbing material.

The light emitting devices may have widths narrower than those of the corresponding windows, and the second light blocking layer may cover gaps formed by the light emitting devices and the first light blocking layer around the windows.

The method of fabricating the unit pixel may further include forming a step adjustment layer covering the second light blocking layer, in which the second light blocking layer and the step adjustment layer may have openings exposing the light emitting devices.

In an exemplary embodiment, the openings of the step adjustment layer may be formed in the openings of the second light blocking layer.

In another variant, forming the first light blocking layer further comprises forming a width of a window to be wider than a width of a corresponding light emitting device, and patterning the second light blocking layer further comprises patterning the second light blocking layer to cover a gap formed by the window of the first light blocking layer and the corresponding light emitting device.

In another exemplary embodiment, the second light blocking layer and the step adjustment layer may be patterned together to form the openings exposing the light emitting devices.

A displaying apparatus according to an exemplary embodiment includes a circuit board, and unit pixels mounted on the circuit board. Each of the unit pixels includes a transparent substrate, a first light blocking layer disposed on the transparent substrate and having windows that transmit light, an adhesive layer covering the first light blocking layer, a plurality of light emitting devices disposed on the adhesive layer to be arranged on the windows, and a second light blocking layer covering side surfaces of the light emitting devices.

The first light blocking layer and the second light blocking layer may include a light absorbing material.

Hereinafter, exemplary embodiments will be described in detail with reference to the accompanying drawings.

FIG. 1 is a schematic plan view illustrating a displaying apparatus according to an exemplary embodiment.

Referring to FIG. 1, a displaying apparatus 10000 may include a panel substrate 2100 and a plurality of pixel modules 1000.

The displaying apparatus 10000 is not particularly limited, but it may include a virtual reality (VR) displaying apparatus such as a micro LED TV, a smart watch, a VR headset, or an argument reality (AR) displaying apparatus such as augmented reality glasses.

The panel substrate 2100 may include a circuit for a passive matrix driving or active matrix driving manner. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the disposed circuit on an upper surface thereof.

In an exemplary embodiment, the plurality of pixel modules 1000 are arranged on the panel substrate 2100. Each of the pixel modules 1000 may include a circuit board 1001 and a plurality of unit pixels 100 disposed on the circuit board 1001. In another exemplary embodiment, the plurality of unit pixels 100 may be arranged directly on the panel substrate 2100.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line, as illustrated in FIG. 1. In an exemplary embodiment, the light emitting devices 10a, 10b, and 10c may be arranged in a vertical direction with respect to a display screen on which an image is implemented. However, the inventive concepts are not limited thereto, and the light emitting devices 10a, 10b, and 10c may be arranged in a lateral direction with respect to the display screen on which the image is implemented.

When the light emitting devices 10a, 10b, and 10c are mounted directly on the panel substrate 2100, it may be difficult to handle mounting of the light emitting devices. On the contrary, cost reduction may be accomplished by first manufacturing the unit pixel 100 on which the light emitting devices 10a, 10b, and 10c are mounted, and then selecting favorable unit pixels 100 and mounting them on the panel substrate 2100.

Hereinafter, each element of the displaying apparatus 10000 will be described in detail in an order of the light emitting devices 10a, 10b, and 10c, the unit pixel 100, and the pixel module 1000 disposed in the displaying apparatus 10000.

Figure 2A:
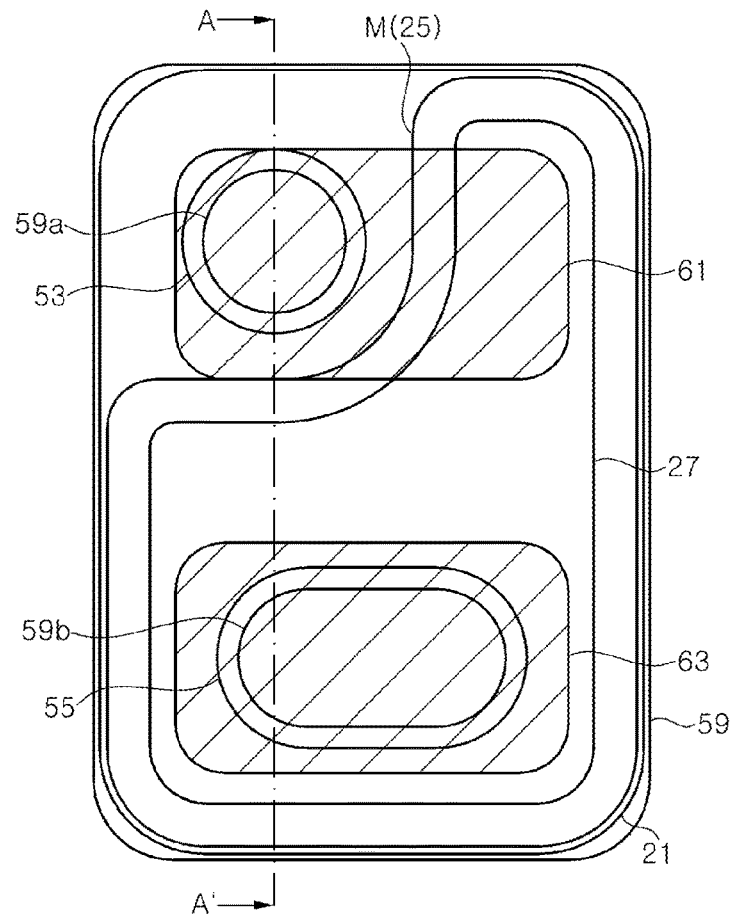
FIG. 2A is a schematic plan view illustrating a light emitting device according to an exemplary embodiment.
Figure 2B:
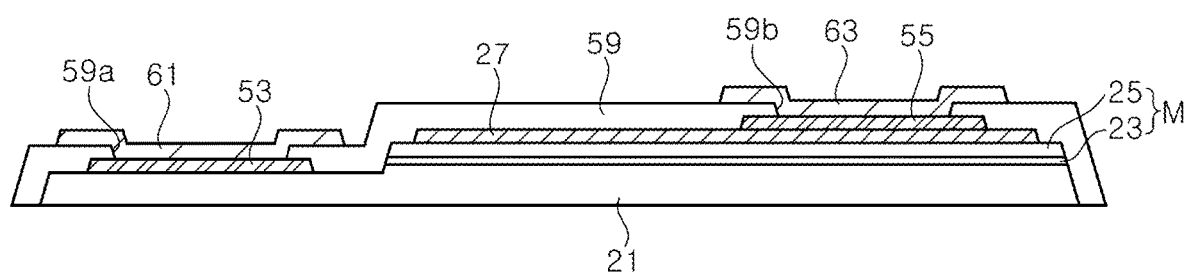
FIG. 2B is a schematic cross-sectional view taken along line A-A' of FIG. 2A.

First, FIG. 2A is a schematic plan view illustrating the light emitting device 10a according to an exemplary embodiment, and FIG. 2B is a schematic cross-sectional view taken along line A-A' of FIG. 2A. Herein, the light emitting device 10a is exemplarily described, but as the light emitting devices 10b and 10c have a substantially similar structure to that of the light emitting device 10a, repeated descriptions thereof will be omitted.

Referring to FIGS. 2A and 2B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10a may have a rectangular shape having a major axis and a minor axis in plan view. For example, a length of the major axis may have a size of about 100 µm or less, and a length of the minor axis may have a size of about 70 µm or less. The light emitting devices 10a, 10b, and 10c may have substantially similar shapes and sizes.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to form at least a portion of the first conductivity type semiconductor layer 21.

In an exemplary embodiment, in the case of the light emitting device 10a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In the case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in the case of the light emitting device 10c emitting blue light, the semiconductor layers may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as Metal Organic Chemical Vapor Deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 2A and 2B, these layers may be multiple layers, and may also include a superlattice layer. The active layer 23 may include a single quantum well structure or a multiple quantum well structure, and a composition ratio of a Nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2B. The mesa M is located on a partial region of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

In an exemplary embodiment, the first conductivity type semiconductor layer 21 may have a flat light exiting surface. In another exemplary embodiment, the first conductivity type semiconductor layer 21 may have a concave-convex pattern formed by surface texturing on a side of the light exiting surface, as shown in FIGS. 3B and 3C. Surface texturing may be carried out by patterning, for example, using a dry or wet etching process. For example, cone-shaped protrusions may be formed on the light exiting surface of the first conductivity type semiconductor layer 21, a height of the cone may be about 2 µm to about 3 µm, a distance between the cones may be about 1.5 µm to about 2 and a diameter of a bottom of the cone may be about 3 µm to about 5 µm. The cone may also be truncated, in which an upper diameter of the cone may be about 2 µm to about 3 µm.

In another exemplary embodiment, the concave-convex pattern may include a first concave-convex pattern and a second concave-convex pattern additionally formed on the first concave-convex pattern.

By forming the concave-convex pattern on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and concave-convex patterns formed on the first conductivity type semiconductors of the light emitting devices 10a, 10b, and 10c may be different from one another, or at least one of the light emitting devices 10a, 10b, and 10c may have a flat surface without including the concave-convex pattern.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. The first contact pad 53 may be omitted.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed of a single layer or multiple layers. The insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degree than that for light incident at a different incident angle. In another exemplary embodiment, the distributed Bragg reflector may have a higher reflectance for light incident at a particular incident angle than that for light incident at the incident angle of 0 degree. For example, the distributed Bragg reflector may have a higher reflectance for light incident at an incident angle of 10 degrees than thar for light incident at the incident angle of 0 degree.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degree for blue light generated in the active layer 23, and further 90% or less, the distributed Bragg reflector formed in the green light emitting device 10b may have a reflectance of about 95% or more and 99% or less at the incident angle of 0 degree for green light, and the distributed Bragg reflector formed in the red light emitting device 10a may have a reflectance of 99% or more at the incident angle of 0 degree for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used. For example, the first and second electrode pads 61 and 63 may include a Ti layer or a Cr layer as an upper most layer, and an Au layer thereunder.

Although the light emitting device 10a according to the exemplary embodiment has been briefly described with reference to FIGS. 2A and 2B, the light emitting device 10a may further include a layer having additional functions in addition to the above-described layers. For example, various layers such as a reflection layer for reflecting light, an additional insulation layer for insulating a specific element, and a solder preventing layer for preventing diffusion of solder may be further included.

When a flip chip type light emitting device is formed, the mesa may be formed to have various shapes, and locations and shapes of the first and second electrode pads 61 and 63 may also be variously modified. In addition, the ohmic contact layer 27 may be omitted, and the second contact pad 55 or the second electrode pad 63 may directly contact the second conductivity type semiconductor layer 25.

Figure 3A:
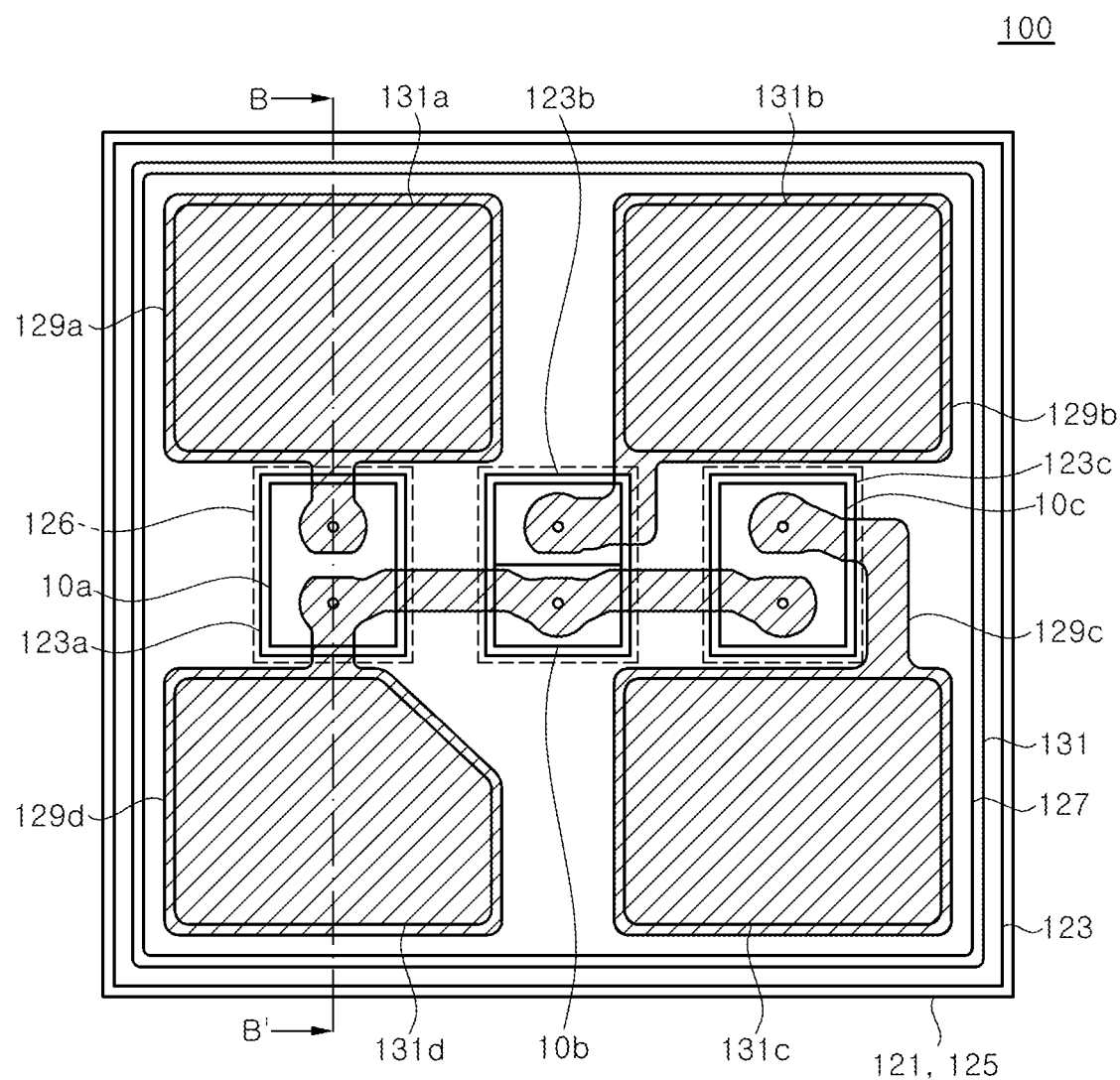
FIG. 3A is a schematic plan view illustrating a unit pixel according to an exemplary embodiment.
Figure 3B:
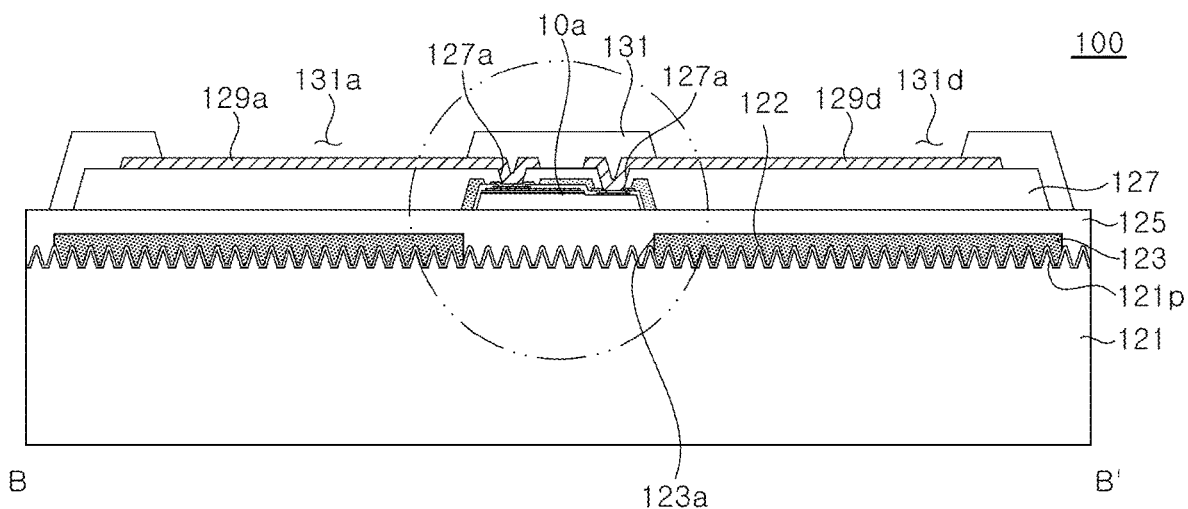
FIG. 3B is a schematic cross-sectional view taken along line B-B' of FIG. 3A.
Figure 3C:
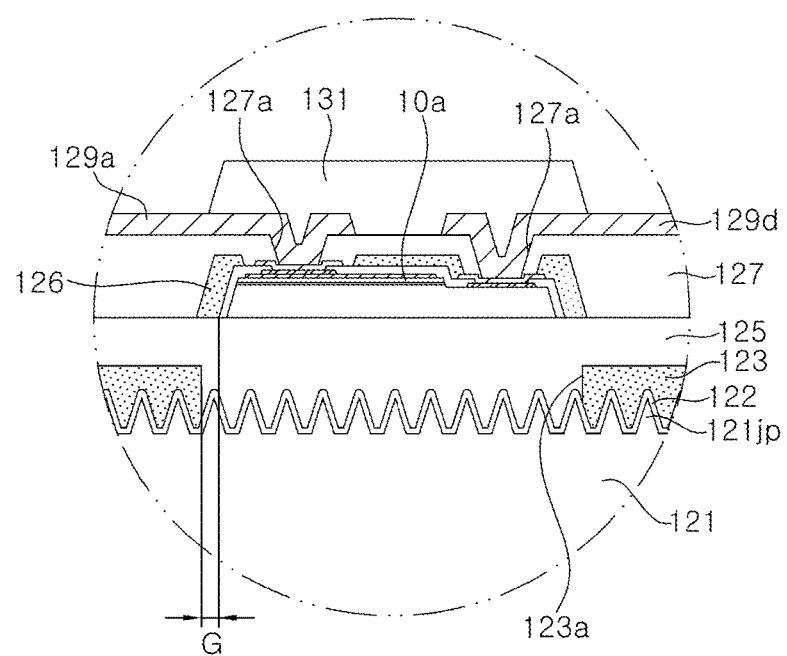
FIG. 3C is a partial cross-sectional view of FIG. 3B.

FIG. 3A is a schematic plan view illustrating a unit pixel 100 according to an exemplary embodiment, FIG. 3B is a schematic cross-sectional view taken along line B-B' of FIG. 3A, and FIG. 3C is a partial cross-sectional view of FIG. 3B.

Referring to FIGS. 3A, 3B, and 3C, the unit pixel 100 may include a transparent substrate 121, a first, a second, and a third light emitting devices 10a, 10b, and 10c, a surface layer 122, a first light blocking layer 123, an adhesive layer 125, a second light blocking layer 126, a step adjustment layer 127, connection layers 129a, 129b, 129c, and 129d, and an insulation material layer 131

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus (10000 in FIG. 1), and light emitted from the light emitting devices 10a, 10b, and 10c is emitted to the outside through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concavo-convex pattern 121p may be regular or irregular. The concave-convex pattern 121p may have a pitch of about 3 μm, a diameter of about 2.8 μm, and a height of about 1.8 μm, for example. The concave-convex pattern 121p may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the first light blocking layer 123 formed thereon. For example, the surface layer 122 may be formed of a silicon oxide layer. The surface layer 122 may be omitted depending on a type of the transparent substrate 121.

The first light blocking layer 123 is formed on the upper surface of the transparent substrate 121. The first light blocking layer 123 may contact the surface layer 122. The first light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the displaying apparatus.

The first light blocking layer 123 may have windows 123a, 123b, and 123c for a light path, so that light generated in the light emitting devices 10a, 10b, and 10c is incident on the transparent substrate 121, and for this purpose, the first light blocking layer 123 on the transparent substrate 121 may be patterned to expose the transparent substrate 121. Widths of the windows 123a, 123b, and 123c may be narrower than those of the light emitting devices, but the inventive concepts are not limited thereto. For example, the widths of the windows 123a, 123b, and 123c may be greater than those of the light emitting devices 10a, 10b, and 10c, and accordingly, as shown in FIG. 3C, a gap corresponding to a width G may be formed between the light emitting device 10a and the first light blocking layer 123.

The adhesive layer 125 is attached onto the transparent substrate 121. The adhesive layer 125 may cover the first light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a, 123b, and 123c formed in the first light blocking layer 123.

The adhesive layer 125 may be formed as a light-transmitting layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10a, 10b and 10c from being observed from the light exiting surface.

Meanwhile, the first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed corresponding to the windows 123a, 123b, and 123c of the first light blocking layer 123.

The first, second, and third light emitting devices 10a, 10b, and 10c may be disposed on a flat surface of the adhesive layer 125 as shown in FIG. 3B. The adhesive layer 125 may be disposed under lower surfaces of the light emitting devices 10a, 10b, and 10c. In another exemplary embodiment, the adhesive layer 125 may partially cover the side surfaces of the first, second, and third light emitting devices 10a, 10b, and 10c.

The first, second, and third light emitting devices 10a, 10b, and 10c may be, for example, a red light emitting device, a green light emitting device, and a blue light emitting device. A detailed configuration of each of the first, second, and third light emitting devices 10a, 10b, and 10c is the same as described above with reference to FIGS. 2A and 2B, a detailed description thereof will be omitted.

The first, second, and third light emitting devices 10a, 10b, and 10c may be arranged in a line, as illustrated in FIG. 3A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut clean. In this case, the clean-cut surfaces of the sapphire substrate 121 may be flush with an arrangement direction of the light emitting devices 10a, 10b, and 10c. For example, in FIG. 3A, the clean-cut surfaces (e.g., m-plane) may be disposed up and down, and the two remaining cut surfaces (e.g., a-plane) may be disposed left and right.

In addition, each of the first, second, and third light emitting devices 10a, 10b, and 10c may be arranged in parallel to one another in a major axis direction. Minor axis directions of the first, second, and third light emitting devices 10a, 10b, and 10c may coincide with an arrangement direction of the light emitting devices.

The first, second, and third light emitting devices 10a, 10b, and 10c may have been those described above with reference to FIGS. 2A and 2B, but the inventive concepts are not limited thereto, and various light emitting devices of a lateral type or a flip-chip structure may be used.

The second light blocking layer 126 may cover the side surfaces of the light emitting devices 10a, 10b, and 10c. The second light blocking layer 126 may also cover upper surfaces of the light emitting devices 10a, 10b, and 10c. The second light blocking layer 126 may have openings exposing the electrode pads 61 and 63 of the light emitting devices 10a, 10b, and 10c.

As shown in FIG. 3A, the second light blocking layer 126 may be disposed on each of the light emitting devices 10a, 10b, and 10c, but the inventive concepts are not limited thereto. A single second light blocking layer 126 may continuously cover the light emitting devices 10a, 10b, and 10c. Furthermore, a portion of the second light blocking layer 126 may cover the adhesive layer 125. The adhesive layer 125 may be disposed between the first light blocking layer 123 and the second light blocking layer 126, and the first light blocking layer 123 and the second light blocking layer 126 may be spaced apart by the adhesive layer 125.

Since the second light blocking layer 126 covers the side surfaces of the light emitting devices 10a, 10b, and 10c, light emitted sidewards from the light emitting devices 10a, 10b, and 10c may be blocked. Accordingly, light interference between the light emitting devices 10a, 10b, and 10c may be prevented.

Further, the second light blocking layer 126 is disposed to cover a gap formed between the light emitting devices 10a, 10b, and 10c and the first light blocking layer 123. As such, it is possible to block unwanted light from being emitted through the gap. For example, light emitted from an adjacent light emitting device may be reflected from the electrode pads 129a, 129b, 129c, and 129d and emitted through the gap. Such light degrades color reproducibility of the displaying apparatus and adversely affects contrast. However, by disposing the second light blocking layer 126 to cover the gap, it is possible to block unwanted light from being emitted to the outside through the gap, and thus, color reproducibility may be improved and contrast may be increased.

The second light blocking layer 126 may be formed of an identical material as that of the first light blocking layer 123, but the inventive concepts are not limited thereto, and may be formed of a different material. The second light blocking layer 126 may absorb or reflect light.

The step adjustment layer 127 covers the first, second, and third light emitting devices 10a, 10b, and 10c and the second light blocking layer 126. The step adjustment layer 127 has openings 127a exposing the first and second electrode pads 61 and 63 of the light emitting devices 10a, 10b, and 10c. The step adjustment layer 127 assists to securely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may contact the adhesive layer 125 around the second light blocking layer 126. The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

A side surface of the step adjustment layer 127 may be inclined at an angle less than 90 degrees with respect to an upper surface of the adhesive layer 125. For example, the side surface of the step adjustment layer 127 may have an inclination angle of about 60 degrees with respect to the upper surface of the adhesive layer 125.

The first, second, third, and fourth connection layers 129a, 129b, 129c, and 129d are formed on the step adjustment layer 127. The connection layers 129a, 129b, 129c, and 129d may be connected to the first and second electrode pads 61 and 63 of the first, second, and third light emitting devices 10a, 10b, and 10c through the openings 127a of the step adjustment layer 127.

In an exemplary embodiment, as illustrated in FIGS. 3A and 3B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and about 50 μm or less, but the inventive concepts are not limited thereto. Meanwhile, a side surface of the insulation material layer 131 may have an inclination angle less than 90 degrees with respect to the upper surface of the adhesive layer 125, for example, an inclination angle of about 60 degrees.

The insulation material layer 131 covers side surfaces of the step adjustment layer 127 and the connection layers 129a, 129b, 129c, and 129d. In addition, the insulation material layer 131 may cover a portion of the adhesive layer 125. The insulation material layer 131 may have openings 131a, 131b, 131c, and 131d exposing the connection layers 129a, 129b, 129c, and 129d, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be formed. In an exemplary embodiment, the bonding pads may be formed to partially cover the light emitting devices 10a, 10b, and 10c outside of upper regions of the first, second, third, and fourth connection layers 129a, 129b, 129c, and 129d.

In the illustrated exemplary embodiment, the light emitting devices 10a, 10b, and 10c are described as being attached to the transparent substrate 121 by the adhesive layer 125, but the light emitting devices 10a, 10b, and 10c may be coupled to the transparent substrate 121 using another coupler instead of the adhesive layer 125. For example, the light emitting devices 10a, 10b, and 10c may be coupled to the transparent substrate 121 using spacers, and thus, gas or liquid may be filled in a region between the light emitting devices 10a, 10b, and 10c and the transparent substrate 121. An optical layer that transmits light emitted from the light emitting devices 10a, 10b, and 10c may be formed by the gas or liquid. The adhesive layer 125 described above is also an example of the optical layer. Herein, the optical layer is formed of a material such as gas, liquid, or solid, different from those of the light emitting devices 10a, 10b, and 10c, and thus, is distinguished from the materials of the semiconductor layers in the light emitting devices 10a, 10b, and 10c.

Figure 4A:
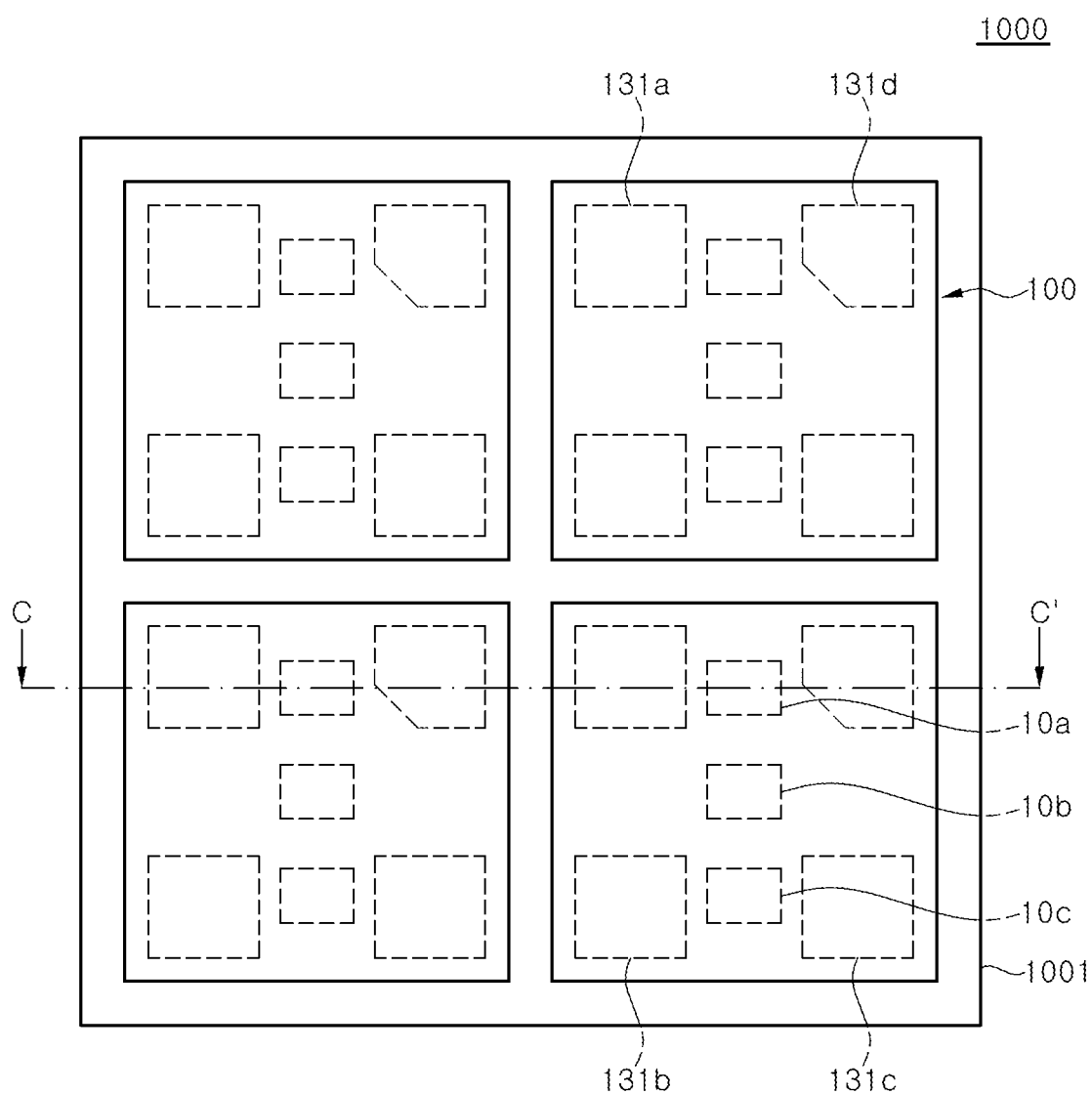
FIG. 4A is a schematic plan view illustrating a pixel module according to an exemplary embodiment.
Figure 4B:
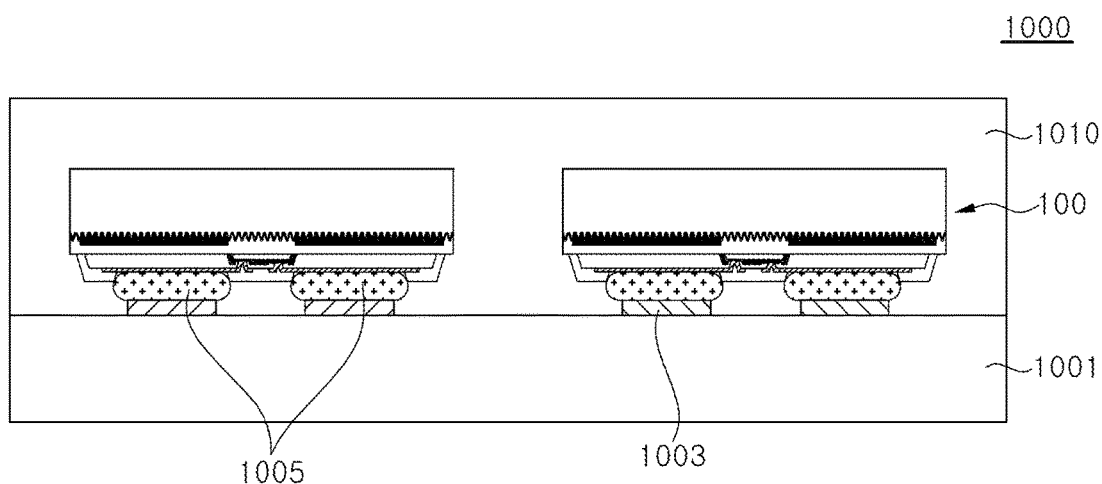
FIG. 4B is a schematic cross-sectional view taken along line C-C' of FIG. 4A.

FIG. 4A is a schematic plan view illustrating a pixel module 1000 according to an exemplary embodiment, and FIG. 4B is a schematic cross-sectional view taken along line C-C' of FIG. 4A.

Referring to FIGS. 4A and 4B, the pixel module 1000 includes a circuit board 1001 and unit pixels 100 arranged on the circuit board 1001. Furthermore, the pixel module 1000 may further include a cover layer 1010 covering the unit pixels 100.

The circuit board 1001 may include a circuit for electrically connecting a panel substrate 2100 and light emitting devices 10a, 10b, and 10c. The circuit in the circuit board 1001 may be formed in a multilayer structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof.

Since a detailed configuration of the unit pixels 100 is the same as described above with reference to FIGS. 3A and 3B, a detailed description thereof will be omitted to avoid redundancy. The unit pixels 100 may be arranged on the circuit board 1001. The unit pixels 100 may be arranged in a 2×2 matrix as shown in FIG. 4A, but the inventive concepts are not limited thereto, and may be arranged in various matrices such as 2×2, 3×3, 5×5, or the like.

The unit pixels 100 are bonded to the circuit board 1001 through a bonding material 1005. For example, the bonding material 1005 bonds connection layers 229a, 229b, 229c, and 229d exposed through the openings 131a of the insulation material layer 131 described with reference to FIGS. 3A and 3B to the pads 1003 on the circuit board 1001. For example, the bonding material 1005 may be solder, and after a solder paste is disposed on the pads 1003 on the circuit board 1001 using a technology such as screen printing, the unit pixel 100 and the circuit board 1001 may be bonded through a reflow process.

According to the illustrated exemplary embodiment, the bonding material 1005 having a single structure may be disposed between the connection layers 129a, 129b, 129c, and 129d and the pads 1003, and the bonding material 1005 may directly connect the connection layers 129a, 129b, 129c, and 129d and the pads 1003.

The cover layer 1010 covers the unit pixels 100. The cover layer 1010 may improve contrast of a displaying apparatus 10000 by preventing light interference between the unit pixels 100.

The cover layer 1010 may be formed of, for example, a dry-film type solder resist (DFSR), a photoimageable solder resist (PSR), a black material (BM), an epoxy molding compound (EMC), or the like. The cover layer 1010 may be formed using, for example, a technique such as lamination, spin coating, slit coating, printing, or the like.

The displaying apparatus 10000 may be provided by mounting the pixel modules 1000 shown in FIGS. 4A and 4B on the panel substrate 2100 of FIG. 1. The circuit board 1001 has bottom pads connected to the pads 1003. The bottom pads may be disposed to correspond to the pads 1003 one-to-one, but the number of the bottom pads may be reduced through a common connection.

In the illustrated exemplary embodiment, the unit pixels 100 may be formed into the pixel module 1000, and the pixel modules 1000 may be mounted on the panel substrate 2100, thereby providing the displaying apparatus 10000, accordingly, a process yield of the displaying apparatus 10000 may be improved. However, the inventive concepts are not limited thereto, and the unit pixels 100 may be mounted directly on the panel substrate 2100.

Figure 5:
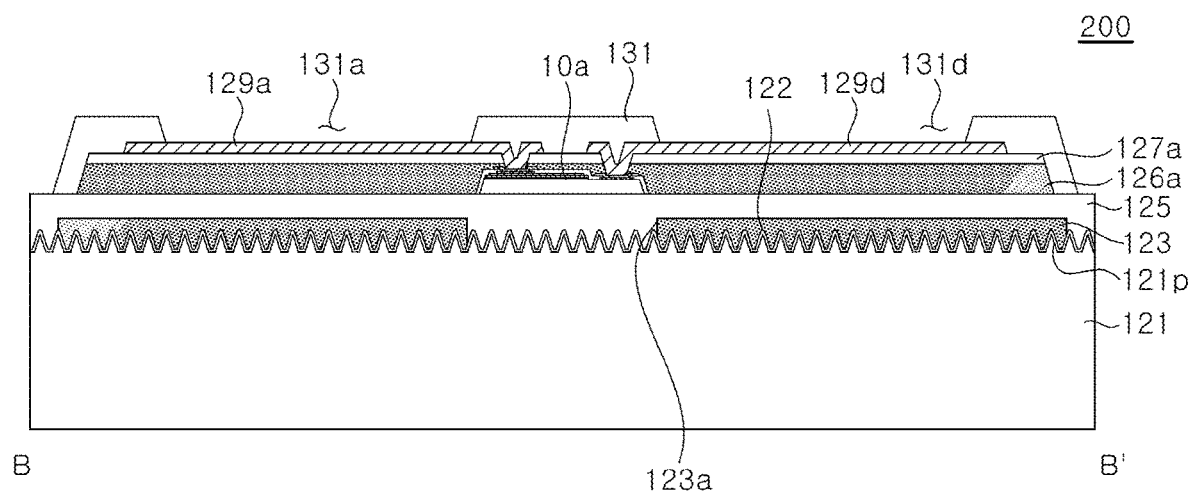
FIG. 5 is a schematic cross-sectional view illustrating a unit pixel according to an exemplary embodiment.

FIG. 5 is a schematic cross-sectional view illustrating a unit pixel 200 according to an exemplary embodiment.

Referring to FIG. 5, the unit pixel 200 according to the illustrated exemplary present embodiment is substantially similar to the unit pixel 100 described with reference to FIGS. 3A through 3C except that a second light blocking layer 126a and a step adjustment layer 127a are patterned together.

That is, in the illustrated exemplary embodiment, after the second light blocking layer 126a and the step adjustment layer 127a are successively applied, the second light blocking layer 126a and the step adjustment layer 127a are patterned together to form openings exposing electrode pads of light emitting devices 10a, 10b, and 10c.

As such, a side surface of the second light blocking layer 126a is exposed without being covered by the step adjustment layer 127a. The step adjustment layer 127a is spaced apart from an adhesive layer 125 by the second light blocking layer 126a. In addition, the second light blocking layer 126a is also exposed on sidewalls of the openings exposing the electrode pads.

According to the illustrated exemplary embodiment, the second light blocking layer 126a and the step adjustment layer 127a can be patterned together, and thus, a manufacturing process of the unit pixel 200 may be simplified.

Figure 6:
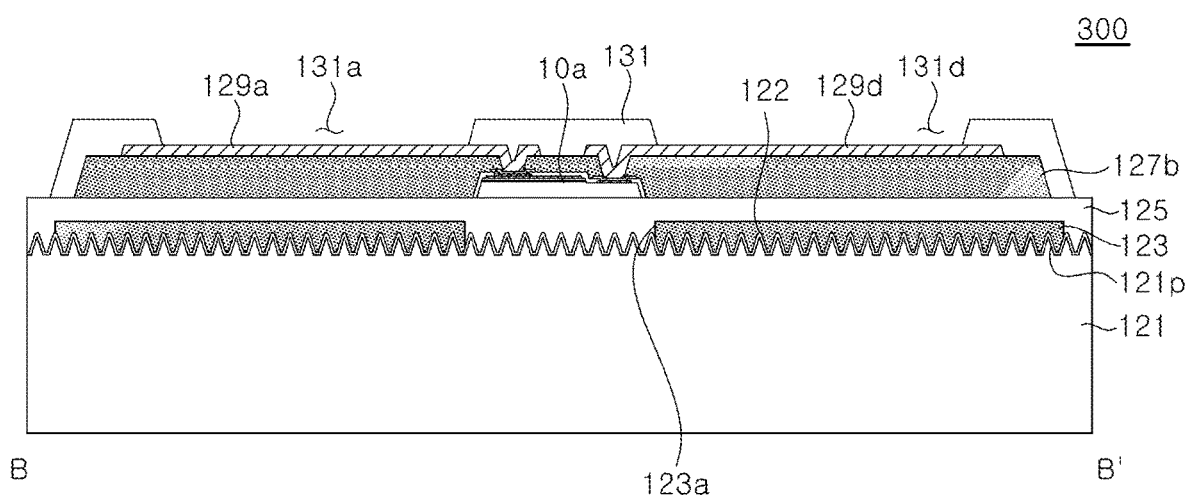
FIG. 6 is a schematic cross-sectional view illustrating a unit pixel according to an exemplary embodiment.

FIG. 6 is a schematic cross-sectional view illustrating a unit pixel 300 according to an exemplary embodiment.

Referring to FIG. 6, the unit pixel 300 according to the illustrated exemplary embodiment is substantially similar to the unit pixel 200 described with reference to FIG. 5 except that the step adjustment layer 127a is omitted and a second light blocking layer 127b is formed to perform a function of the step adjustment layer along with a light blocking function. Accordingly, the second light blocking layer 127b is formed to be relatively thicker than the second light blocking layer 126a of FIG. 5, and the step adjustment layer 127a is omitted. The second light blocking layer 127b may contact an adhesive layer 125 around light emitting devices 10a, 10b, and 10c, and may also contact an insulation material layer 131 over the light emitting devices 10a, 10b, and 10c.

According to the illustrated exemplary embodiment, the light blocking layer and the step adjustment layer do not need to be formed separately, and thus, the manufacturing process may be further simplified.

FIGS. 7A through 7F are schematic cross-sectional views illustrating a method of fabricating a unit pixel 100 according to an exemplary embodiment.

Figure 7A:
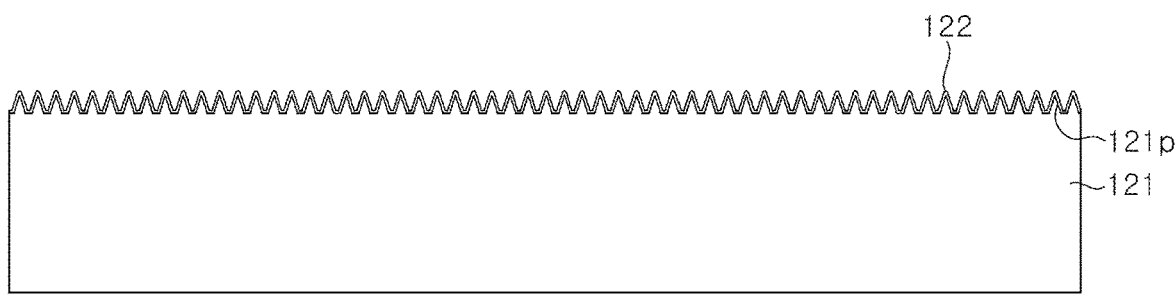
FIGS. 7A through 7F are schematic cross-sectional views illustrating a method of fabricating a unit pixel according to an exemplary embodiment, where.

First, referring to FIG. 7A, a concave-convex pattern 121p is formed on an upper surface of a transparent substrate 121. The transparent substrate 121 is a light transmissive substrate such as PET, glass substrate, quartz, sapphire substrate, or the like. In an exemplary embodiment, the concave-convex pattern 121p may be formed by etching the surface of the transparent substrate 121 using a dry or wet etching technique.

A surface layer 122 may be formed on the transparent substrate 121. The surface layer 122 may be formed along the concave-convex pattern 121p. For example, the surface layer 122 may be formed of a silicon oxide layer. The surface layer 122 is formed to modify the surface of the transparent substrate 121, and may be omitted.

Figure 7B:
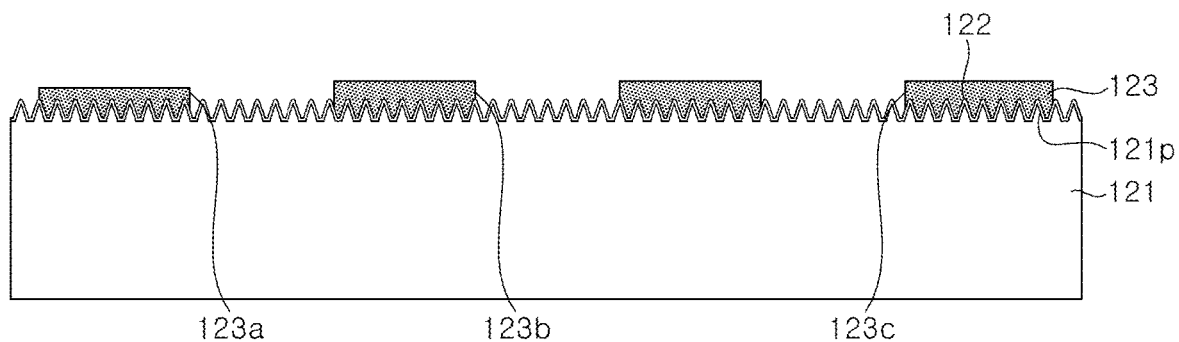

Referring to FIGS. 3A and 7B, a first light blocking layer 123 is formed on the transparent substrate 121. The first light blocking layer 123 may be formed of a light absorbing material layer, for example, a black matrix including a light absorbing material such as carbon black. The first light blocking layer 123 may also be formed of a photosensitive material layer and patterned by exposure and development. Windows 123a, 123b, and 123c may be formed by patterning the first light blocking layer 123. A plurality of windows 123a, 123b, and 123c may be formed corresponding to the light emitting devices 10a, 10b, and 10c, and the windows 123a, 123b, and 123c may be spaced apart from one another.

Although a cross-section of one unit pixel region is illustrated in the illustrated exemplary embodiment, the transparent substrate 121 may be a substrate having a larger area with a diameter of, for example, 4 inches, 6 inches, 8 inches, or the like. The unit pixel region may have, for example, an area of 400 nm×400 nm or less, or further, 240 nm×240 nm or less, and thus, the first light blocking layer 123 may be formed on the transparent substrate 121 to define a plurality of unit pixel regions. The windows 123a, 123b, and 123c are formed in each of the unit pixel regions.

Figure 7C:
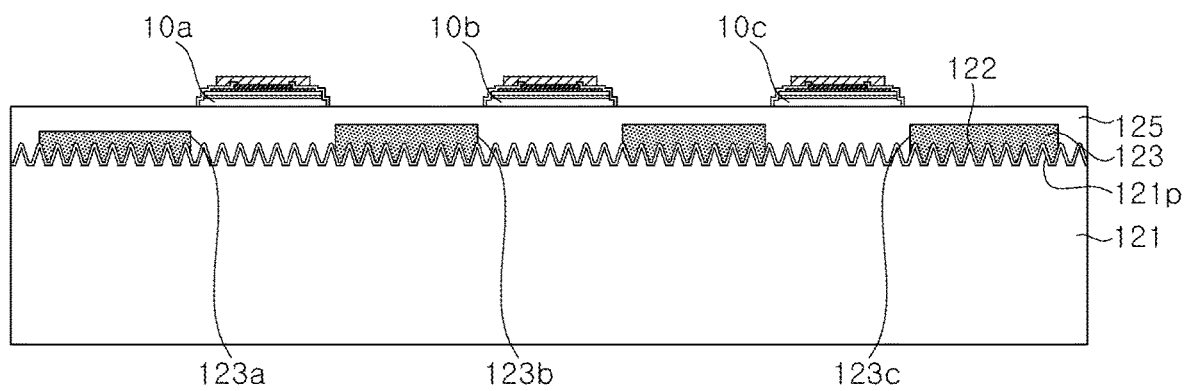

Referring to FIGS. 3A and 7C, an adhesive layer 125 may be formed on the first light blocking layer 123. The adhesive layer 125 may cover the light blocking layer 123, and may also cover the surface layer 122 or the transparent substrate 121 exposed through the windows 123a, 123b and 123c formed in the light blocking layer 123.

The adhesive layer 125 may be formed on an entire surface of the transparent substrate 121, but the inventive concepts are not limited thereto, and, in some exemplary embodiments, the adhesive layer 125 may be formed on a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may be formed as a light-transmitting layer, and transmits light emitted from the light emitting devices 10a, 10b, and 10c. The adhesive layer 125 may be formed using an adhesive sheet or an organic adhesive. For example, the adhesive layer 125 may be formed using a transparent epoxy. In an exemplary embodiment, the adhesive layer 125 may include a diffuser such as $SiO_2$, $TiO_2$, ZnO, or the like to diffuse light. The light diffusing material prevents the light emitting devices 10a, 10b and 10c from being observed from the light exiting surface. As shown in FIG. 7C, the adhesive layer 125 may cover a side surface of the first light blocking layer 123.

Subsequently, the light emitting devices 10a, 10b, and 10c are disposed on the adhesive layer 125. The light emitting devices 10a, 10b, and 10c may be transferred to the adhesive layer 125 using a transferring process. A plurality of unit pixel regions may be defined on the transparent substrate 121, each of the light emitting devices 10a, the light emitting devices 10b, and the light emitting devices 10c may be transferred through separate processes, or the light emitting devices 10a, 10b, and 10c may be transferred together.

The light emitting devices 10a, 10b, and 10c may be disposed corresponding to the windows 123a, 123b, and 123c, respectively. The light emitting devices 10a, 10b, and 10c may have a size smaller than that of the windows 123a, 123b, and 123c and may be located in upper regions of the windows 123a, 123b, and 123c, respectively. In another exemplary embodiment, the light emitting devices 10a, 10b, and 10c may have a larger area than that of the windows 123a, 123b, and 123c, respectively.

Figure 7D:
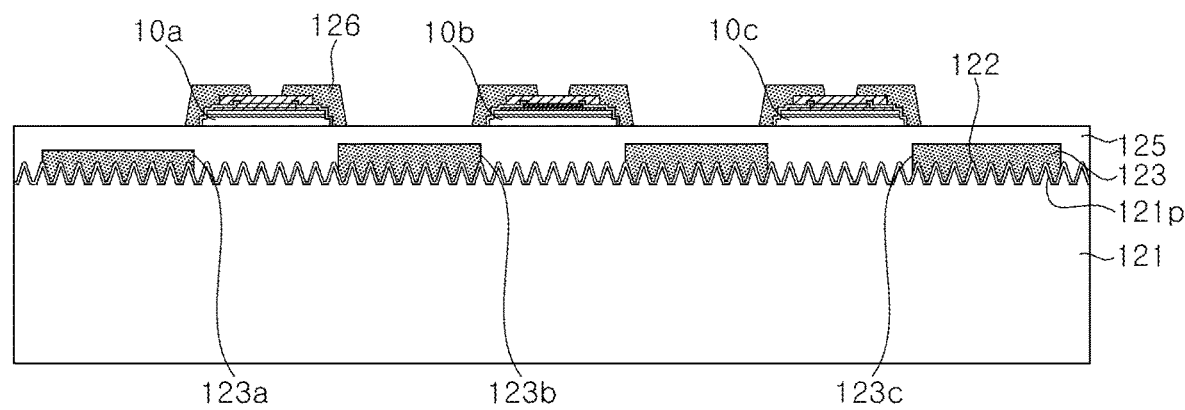

Referring to FIGS. 3A and 7D, a second light blocking layer 126 covering the light emitting devices 10a, 10b, and 10c is formed. The second light blocking layer 126 may have openings exposing electrode pads of each of the light emitting devices 10a, 10b, and 10c. The second light blocking layer 126 may be formed by forming a material layer covering the adhesive layer 125 and the light emitting devices 10a, 10b, and 10c, and by patterning the material layer. The second light blocking layer 126 is formed to cover side surfaces of the light emitting devices 10a, 10b, and 10c in particular, and to cover a gap G between the light emitting devices 10a, 10b, and 10c and the first light blocking layer 123.

Figure 7E:
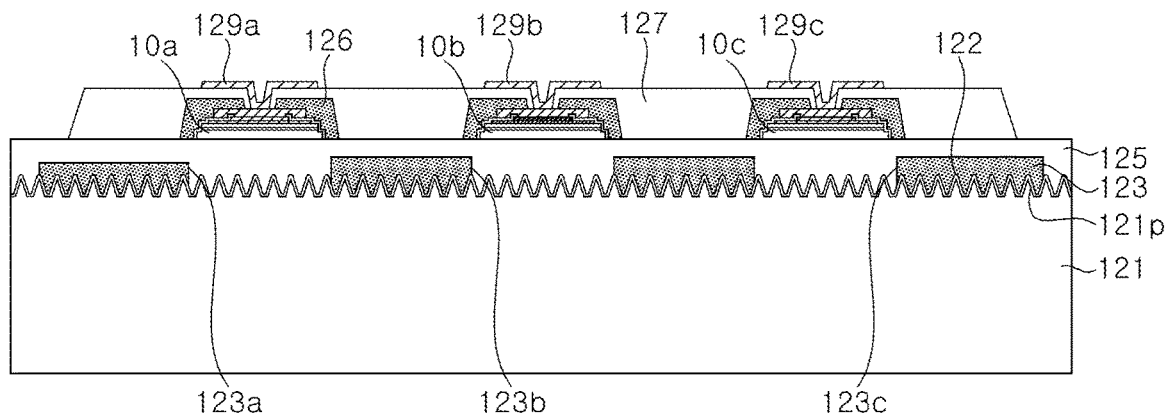

Referring to FIGS. 3A and 7E, a step adjustment layer 127 is formed to cover the light emitting devices 10a, 10b, and 10c. The step adjustment layer 127 covers the second light blocking layer 126. The step adjustment layer 127 may be formed of, for example, photosensitive polyimide, and may be patterned using exposure and development techniques.

The step adjustment layer 127 may have openings 127a exposing the light emitting devices 10a, 10b, and 10c. For example, the openings 127a of the step adjustment layer 127 may expose first and second electrode pads (61 and 63 of FIG. 2B.) Furthermore, the step adjustment layer 127 may be removed along the edge of the transparent substrate 121 to expose the adhesive layer 125.

Figure 7F:
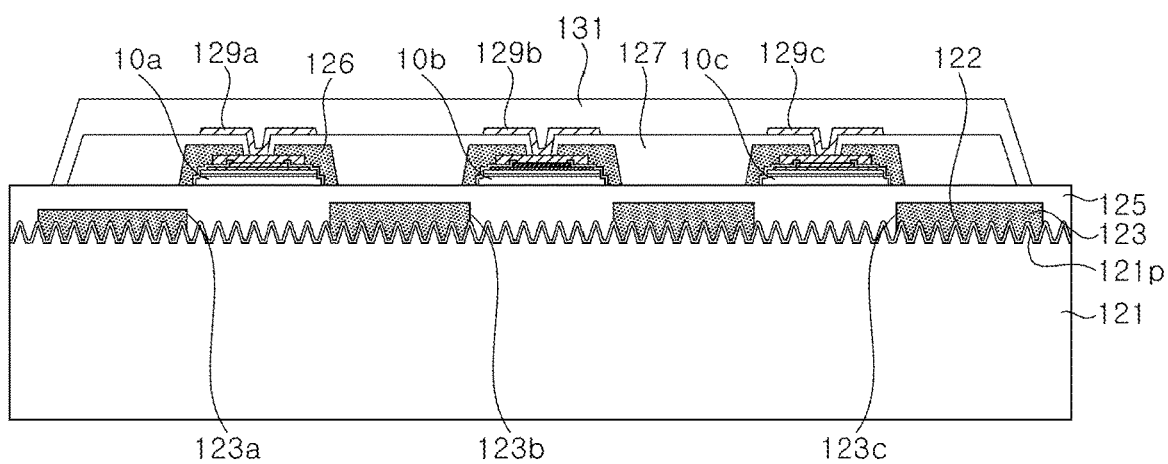

Referring to FIGS. 3A and 7F, first, second, third, and fourth connection layers 129a, 129b, 129c, and 129d are formed on the step adjustment layer 127. For example, the first, second, third, and fourth connection layers 129a, 129b, 129c, and 129d may be formed using a lift-off technology.

The connection layers 129a, 129b, 129c, and 129d may be connected to the light emitting devices 10a, 10b, and 10c through the openings 127a of the step adjustment layer 127. For example, the first, second, and third connection layers 129a, 129b, and 129c may be electrically connected to first conductivity type semiconductor layers of the light emitting devices 10a, 10b, and 10c, respectively, and the fourth connection layer 129d may be electrically connected to second conductivity type semiconductor layers of the light emitting devices 10a, 10b, and 10c.

Subsequently, an insulation material layer 131 may be formed. The insulation material layer 131 covers the first, second, third, and fourth connection layers 129a, 129b, 129c, and 129d. The insulation material layer 131 may have openings 131a, 131b, 131c, and 131d exposing the first, second, third, and fourth connection layers 129a, 129b, 129c, and 129d as shown in FIG. 3A, pad regions may be defined by the openings 131a, 131b, 131c, and 131d.

In the illustrated exemplary embodiment, it has been described that the step adjustment layer 127 is formed after the second light blocking layer 126 is formed, but the unit pixels 200 may be formed by patterning the second light blocking layer 126 and the step control layer 127 together after the second light blocking layer 126 and the step control layer 127 are successively applied, or the unit pixels 300 may be formed by omitting the second light blocking layer 126 and forming the step adjustment layer 127 as a light blocking material layer.

Figure 8:
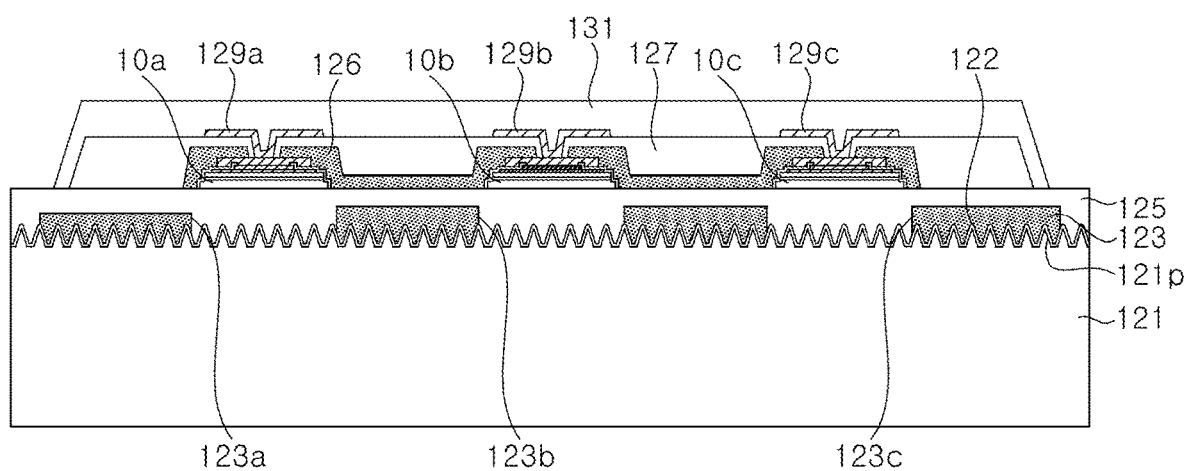
FIG. 8 is a schematic cross-sectional view illustrating a unit pixel according to another exemplary embodiment.

FIG. 8 is a schematic cross-sectional view illustrating a unit pixel according to another exemplary embodiment.

Referring to FIG. 8, the unit pixel according to the illustrated exemplary embodiment is substantially similar to the unit pixel 100 described with reference to FIGS. 3A and 3B, except that a second light blocking layer 126 continuously covers light emitting devices. 10a, 10b, and 10c. That is, the second light blocking layer 126 covers an adhesive layer 125 even in a region between light emitting devices 10a, 10b, and 10c. Meanwhile, an outermost edge of the second light blocking layer 126 may be disposed close to the light emitting devices 10a, 10b, and 10c as illustrated, but the inventive concepts are not limited thereto. In the illustrated exemplary embodiment, the outermost edge of the second light blocking layer 126 may be in any region between an outermost edge of a step adjustment layer 127 and the light emitting devices 10a, 10b, and 10c.

According to the illustrated exemplary embodiment, it is possible to prevent light interference from occurring through the region between the light emitting devices 10a, 10b, and 10c, and thus, light emitted from the light emitting devices 10a, 10b, and 10c may be further limitedly emitted to corresponding windows 123a, 123b, and 123c.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:
1. A unit pixel, comprising:
a transparent substrate;
a first light blocking layer disposed on the transparent substrate and having windows that transmit light therethrough;
an adhesive layer covering the first light blocking layer;

a plurality of light emitting devices disposed on the adhesive layer to correspond to the windows;
a second light blocking layer covering side surfaces of the light emitting devices; and
a step adjustment layer covering the second light blocking layer, wherein the step adjustment layer is separated from the adhesive layer by the second light blocking layer, wherein the second light blocking layer and the step adjustment layer have openings exposing the light emitting devices, and wherein the openings of the step adjustment layer are located within the openings of the second light blocking layer.

2. The unit pixel of claim 1, wherein each of the first light blocking layer and the second light blocking layer includes a light absorbing material.

3. The unit pixel of claim 1, wherein each width of the light emitting devices has a size smaller than a width of a corresponding window, and the second light blocking layer covers gaps between each width of the light emitting devices and the width of the corresponding window.

4. The unit pixel of claim 3, wherein the second light blocking layer is divided into one another at multiple locations and covers the side surfaces of the corresponding light emitting devices at the multiple locations.

5. The unit pixel of claim 3, wherein the second light blocking layer continuously covers the side surfaces of the light emitting devices.

6. The unit pixel of claim 3, wherein the second light blocking layer covers the adhesive layer around the light emitting devices.

7. The unit pixel of claim 1, wherein the step adjustment layer is formed of polyimide.

8. The unit pixel of claim 1, wherein the step adjustment layer contacts the adhesive layer around the second light blocking layer.

9. The unit pixel of claim 1, further comprising:
connection layers electrically connected to the light emitting devices through the openings of the second light blocking layer and the step adjustment layer; and
an insulation material layer covering the connection layers, wherein the insulation material layer has openings exposing the connection layers.

10. The unit pixel of claim 9, wherein the step adjustment layer and the insulation material layer have side surfaces inclined to have an inclination angle of less than 90 degrees with respect to an upper surface of the adhesive layer.

11. A method of fabricating a unit pixel, comprising:
forming a first light blocking layer having a plurality of windows on a transparent substrate;
forming an adhesive layer covering the first light blocking layer;
mounting light emitting devices on the adhesive layer to correspond to the plurality of windows;
forming a second light blocking layer and patterning the second light blocking layer to cover side surfaces of the light emitting devices; and
forming a step adjustment layer covering the second light blocking layer, wherein the step adjustment layer is separated from the adhesive layer by the second light blocking layer;
forming a first set of openings in the second light blocking layer; and
forming a second set of openings in the step adjustment layer, wherein the second set of openings of the step adjustment layer are formed in the first set of openings of the second light blocking layer.

12. The method of fabricating the unit pixel of claim 11, wherein the first and the second light blocking layers include a light absorbing material.

13. The method of fabricating the unit pixel of claim 11, wherein forming the first light blocking layer further comprises forming a width of a window to be wider than a width of a corresponding light emitting device, and patterning the second light blocking layer further comprises patterning the second light blocking layer to cover a gap formed by the window of the first light blocking layer and the corresponding light emitting device.

14. The method of fabricating the unit pixel of claim 11, further comprising:
patterning the second light blocking layer and the step adjustment layer together to form the first set and the second set of openings exposing the light emitting devices.

15. A displaying apparatus, comprising:
a circuit board; and
unit pixels mounted on the circuit board, each of the unit pixels comprising:
a transparent substrate;
a first light blocking layer disposed on the transparent substrate and having a plurality of windows that transmit light;
an adhesive layer covering the first light blocking layer;
a plurality of light emitting devices disposed on the adhesive layer to correspond to the windows;
a second light blocking layer covering side surfaces of the light emitting devices; and
a step adjustment layer covering the second light blocking layer, wherein the step adjustment layer is separated from the adhesive layer by the second light blocking layer, wherein the second light blocking layer and the step adjustment layer have openings exposing the light emitting devices, and wherein the openings of the step adjustment layer are located within the openings of the second light blocking layer.

16. The displaying apparatus of claim 15, wherein the first light blocking layer and the second light blocking layer include a light absorbing material.

17. The displaying apparatus of claim 15, wherein each width of the light emitting devices has a size smaller than a width of a corresponding window, and the second light blocking layer covers gaps between each width of the light emitting devices and the width of the corresponding window.

18. The displaying apparatus of claim 17, wherein the second light blocking layer is divided into one another at multiple locations and covers the side surfaces of the corresponding light emitting devices at the multiple locations.

19. The displaying apparatus of claim 17, wherein the second light blocking layer covers the adhesive layer around the light emitting devices.

20. The displaying apparatus of claim 15, wherein each of the unit pixels further comprises:
connection layers electrically connected to the light emitting devices through the openings of the second light blocking layer and the step adjustment layer; and
an insulation material layer covering the connection layers, wherein the insulation material layer has openings exposing the connection layers.

* * * * *